US011056318B2

(12) United States Patent
Suzuki et al.

(10) Patent No.: US 11,056,318 B2
(45) Date of Patent: Jul. 6, 2021

(54) PLASMA PROCESSING APPARATUS

(71) Applicant: TOKYO ELECTRON LIMITED, Tokyo (JP)

(72) Inventors: Takashi Suzuki, Miyagi (JP); Yoshikazu Azumaya, Miyagi (JP); Yukari Isozaki, Miyagi (JP); Masashi Oshida, Miyagi (JP); Shin Yamashita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 119 days.

(21) Appl. No.: 16/351,237

(22) Filed: Mar. 12, 2019

(65) Prior Publication Data

US 2019/0287768 A1  Sep. 19, 2019

(30) Foreign Application Priority Data

Mar. 16, 2018 (JP) .............................. JP2018-049470

(51) Int. Cl.
*H01J 37/32* (2006.01)

(52) U.S. Cl.
CPC .... *H01J 37/32449* (2013.01); *H01J 37/3222* (2013.01); *H01J 37/3244* (2013.01); *H01J 37/32238* (2013.01)

(58) Field of Classification Search
USPC ................................................ 118/715–733
See application file for complete search history.

(56) References Cited

U.S. PATENT DOCUMENTS

| | | | | |
|---|---|---|---|---|
| 2004/0149210 A1* | 8/2004 | Fink | ..................... | H01L 21/6719 118/715 |
| 2004/0221809 A1* | 11/2004 | Ohmi | ..................... | C23C 16/24 118/715 |
| 2006/0219361 A1* | 10/2006 | Wang | ................... | H01J 37/3244 156/345.33 |
| 2008/0110400 A1* | 5/2008 | Satou | ................... | H01J 37/3244 118/723 VE |
| 2012/0003836 A1* | 1/2012 | Kellogg | ............ | H01L 21/68735 438/710 |
| 2015/0228459 A1* | 8/2015 | Matsumoto | ....... | H01J 37/32449 438/714 |
| 2019/0221432 A1* | 7/2019 | Adachi | ............. | H01L 21/68792 |

FOREIGN PATENT DOCUMENTS

JP 2014-096553 A 5/2014

* cited by examiner

*Primary Examiner* — Rakesh K Dhingra
(74) *Attorney, Agent, or Firm* — Studebaker & Brackett PC

(57) ABSTRACT

A plasma processing apparatus includes: a processing container formed by assembling a container upper portion having an upper side wall and a container lower portion having a lower side wall; a stage provided in the container lower portion of the processing container; and a peripheral introduction part configured to be an assembly, configured to be sandwiched between the upper side wall and the lower side wall, and configured to provide a plurality of gas discharge ports arranged in the circumferential direction with respect to an axis passing through a center of the stage, the assembly in which at least two members are assembled, the at least two members forming a gas flow path extending in a circumferential direction with respect to the axis in an interior thereof, in which the peripheral introduction part, the container upper portion and the container lower portion are thermally and electrically connected to each other.

8 Claims, 15 Drawing Sheets

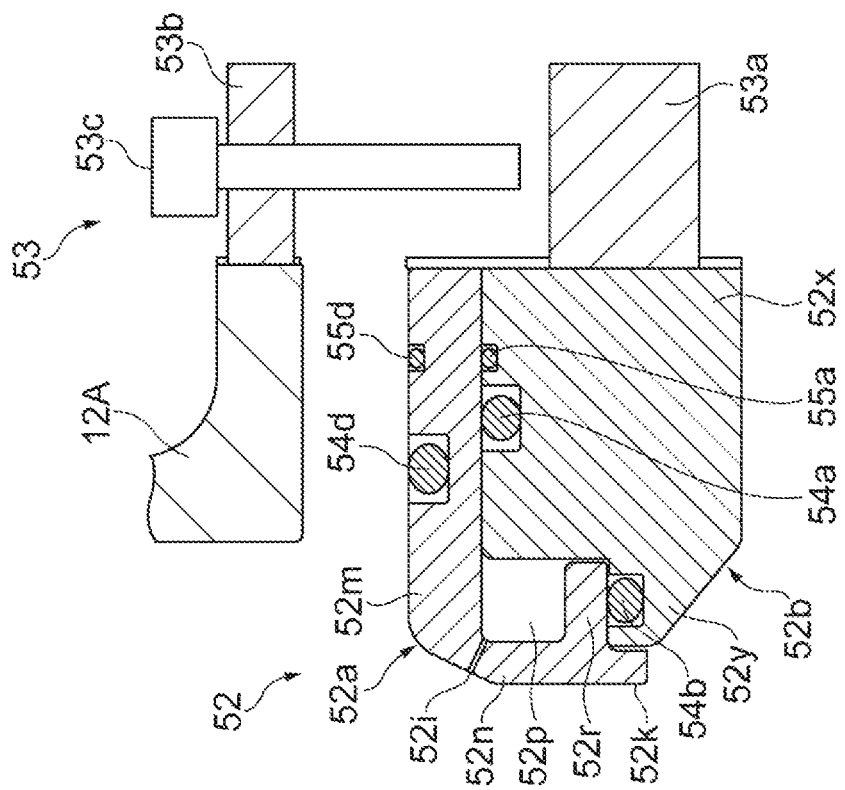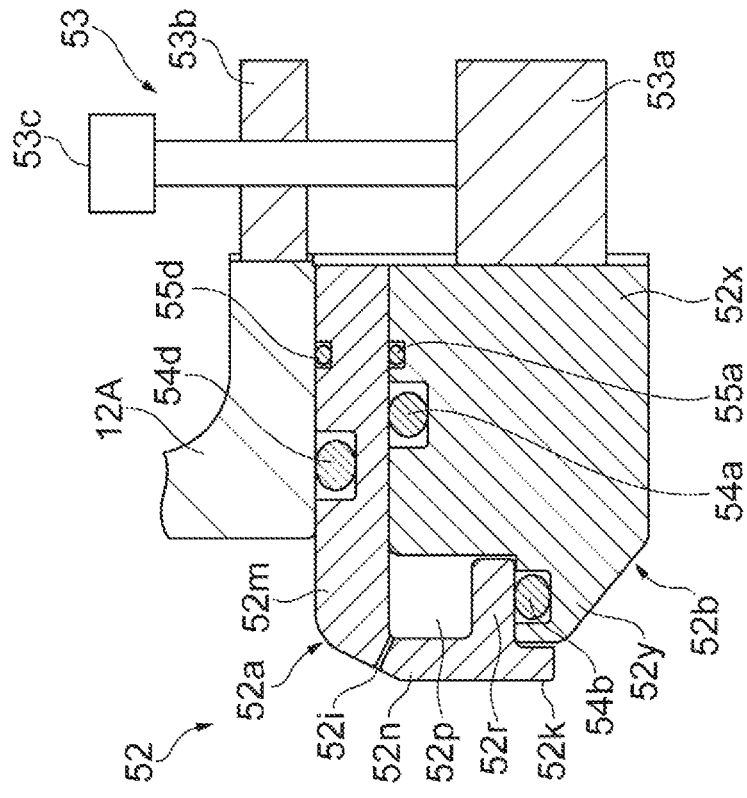

PLASMA PROCESSING APPARATUS

CROSS-REFERENCE TO RELATED APPLICATIONS

This application is based on and claims the benefit of priority from Japanese Patent Application No. 2018-049470 filed on Mar. 16, 2018, and the entire contents of which are incorporated herein by reference.

FIELD

Exemplary embodiments of the disclosure relates to a plasma processing apparatus.

BACKGROUND

In the manufacture of electronic devices, plasma processing such as plasma etching is applied to an object to be processed. Japanese Unexamined Patent Publication No. 2014-096553 discloses a plasma processing apparatus for performing plasma processing on an object to be processed. The plasma processing apparatus disclosed in Japanese Unexamined Patent Publication No. 2014-096553 is a plasma processing apparatus which generates plasma by microwaves, and includes a stage, a central introduction part, and a peripheral introduction part. The object to be processed is placed on the stage. The central introduction part introduces gas from above the stage along an axis passing through the center of the stage in a vertical direction. Further, the peripheral introduction part is formed of a ring-shaped member having a gas flow path formed in the interior thereof and is provided along a side wall at a height position between a gas discharge port of the central introduction part and the stage. A plurality of gas discharge ports arranged in a circumferential direction are formed in the peripheral introduction part. A pipe communicating with the gas flow path in the interior of the peripheral introduction part is connected to the peripheral introduction part. A connection place between the peripheral introduction part and the pipe is fixed such that the peripheral introduction part and the pipe are not separated from each other. Specifically, a gas introduction portion of the peripheral introduction part and a tip portion of the pipe are fixed to the side wall of the processing container by a fixing member.

SUMMARY

In first aspect, a plasma processing apparatus includes: a processing container formed by assembling a container upper portion having an upper side wall and a container lower portion having a lower side wall; a stage provided in the container lower portion of the processing container; and a peripheral introduction part configured to be an assembly, configured to be sandwiched between the upper side wall and the lower side wall, and configured to provide a plurality of gas discharge ports arranged in the circumferential direction with respect to an axis passing through a center of the stage, the assembly in which at least two members are assembled, the at least two members forming a gas flow path extending in a circumferential direction with respect to the axis in an interior thereof, in which the peripheral introduction part, the container upper portion and the container lower portion are thermally and electrically connected to each other.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 15A and 15B are sectional views for describing an example of a pushing screw mechanism for disconnecting connection between a container upper portion and the peripheral introduction part.

DETAILED DESCRIPTION

Figure 1:
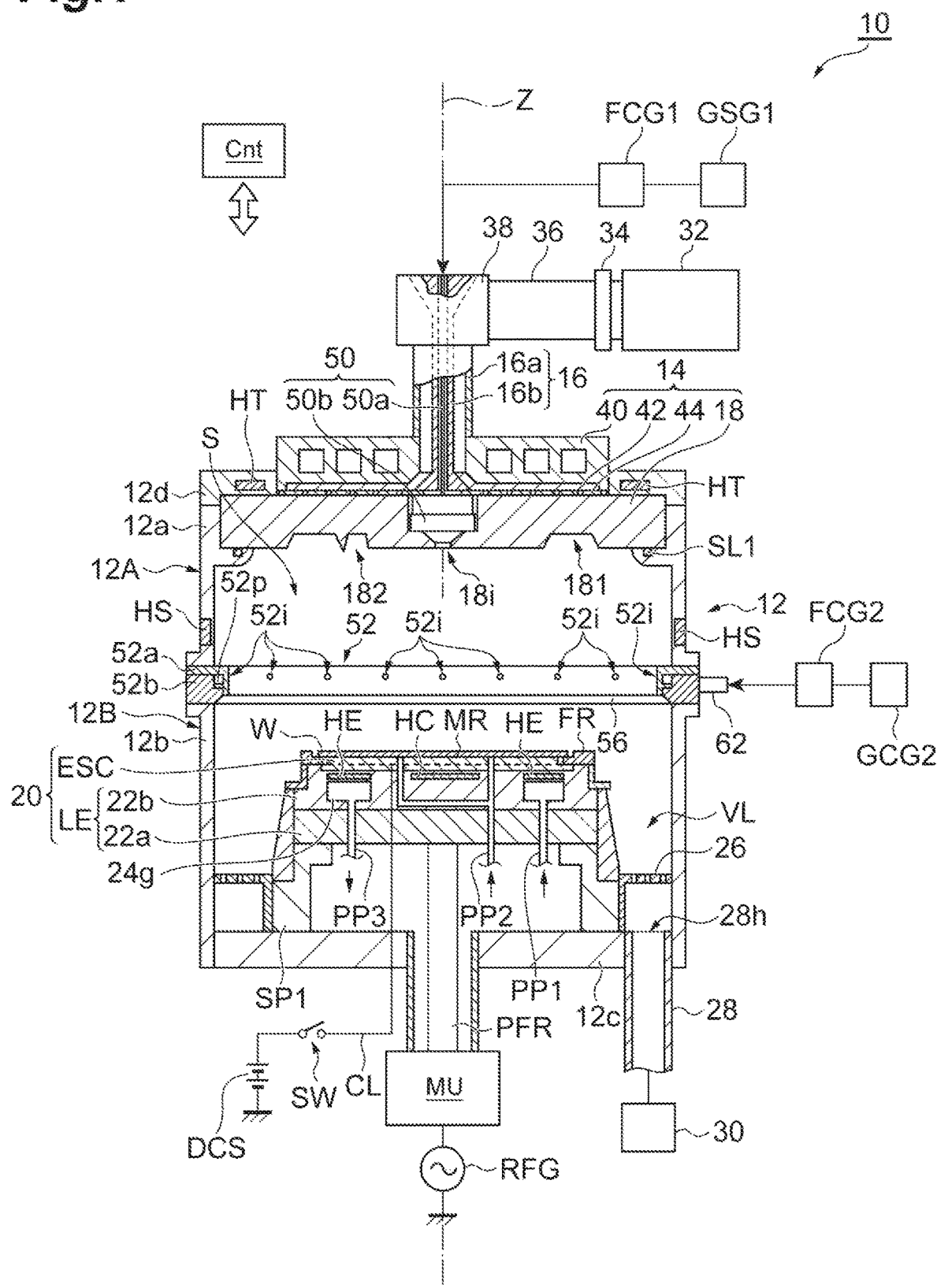
FIG. 1 is a sectional view schematically illustrating a plasma processing apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In the plasma processing apparatus disclosed in Japanese Unexamined Patent Publication No. 2014-096553, the ring-shaped peripheral introduction part rises in temperature due to plasma heat or the like. The ring-shaped peripheral introduction part thermally expands in a radial direction according to a rise in temperature. Since the connection place between the ring-shaped peripheral introduction part and the pipe serves as a fixed end, there is a concern that the ring-shaped peripheral introduction part may not expand equally in the radial direction. In this case, since the axis passing through the center of the stage and the axis passing through the center of the ring-shaped peripheral introduction part are shifted from each other, there is a concern that bias may occur in the distribution of gas. That is, there is a concern that the uniformity of the plasma processing on the object to be processed may be reduced.

Further, it is necessary to periodically clean the peripheral introduction part. Since the peripheral introduction part described in Japanese Unexamined Patent Publication No. 2014-096553 is a ring-shaped member in which a gas flow path is formed in the interior thereof, cleaning work is not easy.

Therefore, in the plasma processing apparatus, it is necessary to suppress a decrease in uniformity of plasma processing due to thermal expansion of the peripheral introduction part and improve maintainability of the peripheral introduction part.

According to one aspect, a plasma processing apparatus for performing plasma processing on an object to be processed is provided. The plasma processing apparatus includes a processing container, a stage, and a peripheral introduction part. The processing container is formed by assembling a container upper portion having an upper side wall and a container lower portion having a lower side wall. The stage is provided in the container lower portion of the processing container. The peripheral introduction part is an assembly in which at least two members are assembled, so that a gas flow path extending in a circumferential direction with respect to an axis passing through a center of the stage is formed in an interior thereof. The peripheral introduction part is sandwiched between the upper side wall and the lower side wall and provides a plurality of gas discharge ports arranged in the circumferential direction with respect to the axis. The peripheral introduction part, and the container upper portion and the container lower portion are thermally and electrically connected to each other.

According to this plasma processing apparatus, since the peripheral introduction part is an assembly, the interior of the gas flow path can be cleaned by releasing the coupling between at least two members forming the gas flow path. Further, according to this plasma processing apparatus, since the ring-shaped peripheral introduction part is fixed by being sandwiched between the upper side wall and the lower side wall, it can thermally expand uniformly in the circumferential direction. For this reason, in this plasma processing apparatus, it is possible to avoid positional misalignment between the axis passing through the center of the stage and the axis passing through the center of the ring-shaped peripheral introduction part. Therefore, in this plasma processing apparatus, it is possible to suppress a decrease in the uniformity of the plasma processing due to the thermal expansion of the peripheral introduction part and to improve the maintainability of the peripheral introduction part.

In one aspect, the at least two members may include a first ring member and a second ring member, and the gas flow path may be formed by assembling the first ring member and the second ring member. In this case, in this plasma processing apparatus, the entire interior of the gas flow path can be opened by releasing the coupling between the first ring member and the second ring member. Therefore, in this plasma processing apparatus, the maintainability can be further improved.

In one aspect, the container lower portion and the second ring member may be positioned by a first pin extending along the axis, and the second ring member, the first ring member, and the container upper portion may be positioned by a second pin extending along the axis. In this case, in this plasma processing apparatus, positioning of the container upper portion, the first ring member, the second ring member, and the container lower portion can be performed by the first pin and the second pin.

In one aspect, the peripheral introduction part, the container upper portion, and the container lower portion may be formed of the same material. In this case, the thermal expansion coefficients of the peripheral introduction part, the container upper portion, and the container lower portion become the same. Therefore, in this plasma processing apparatus, the axis passing through the center of the stage and the axis passing through the center of the ring-shaped peripheral introduction part can be prevented from being shifted from each other due to the difference in thermal expansion between the processing container and the peripheral introduction part.

In one aspect, the peripheral introduction part, the container upper portion, and the container lower portion may be formed of aluminum.

In one aspect, an aluminum oxide film may be formed on an inner wall of the gas flow path, and the gas discharge port may communicate with a corner portion of a cross-section of the gas flow path. The aluminum oxide film is formed by alumite treatment. At the time of the alumite treatment, air pockets tend to be formed at the corner portion of the cross-section of the gas flow path. In this plasma processing apparatus, the gas discharge port is formed at the corner portion of the cross-section of the gas flow path, so that it is possible to prevent the air pockets from staying in the corner portion.

In one aspect, the plasma processing apparatus may further include a central introduction part which is provided above the stage and introduces gas toward the stage along the axis, and an antenna for introducing microwaves into the processing container. The antenna may be provided to face the stage above the stage and have a dielectric window which is in contact with a space in the processing container. A gas discharge port of the central introduction part, which extends along the axis, may be formed in the dielectric window. According to this plasma processing apparatus, gas can also be supplied from the central introduction part and plasma can be excited by using the antenna.

As described above, the plasma processing apparatus is provided in which a decrease in uniformity of plasma processing due to thermal expansion of the peripheral introduction part is suppressed and maintainability of the peripheral introduction part is improved.

Hereinafter, various exemplary embodiments will be described in detail with reference to the drawings. In each drawing, identical or corresponding portions are denoted by the same reference numerals.

[Outline of Plasma Processing Apparatus]

FIG. 1 is a sectional view schematically illustrating a plasma processing apparatus according to an exemplary embodiment. A plasma processing apparatus 10 illustrated in FIG. 1 is an apparatus for performing plasma processing on an object to be processed. The plasma processing apparatus is provided with a processing container 12. The processing container 12 provides a processing space S for accommodating the object to be processed. An example of the object to be processed is a wafer W.

The processing container 12 is formed by assembling a container upper portion 12A having an upper side wall 12a and a container lower portion 12B having a lower side wall 12b. The assembly of the container upper portion 12A and the container lower portion 12B will be described later. The processing container 12 has a side wall which includes the upper side wall 12a and the lower side wall 12b. The processing container 12 can further include a bottom portion 12c and a top portion 12d. Each of the upper side wall 12a and the lower side wall 12b has a substantially cylindrical shape extending in a direction in which an axis Z extends. The axis Z is, for example, an axis which passes through the center of a stage (described later) in a vertical direction. In one exemplary embodiment, the central axes of the upper side wall 12a and the lower side wall 12b coincide with the axis Z. The inner diameter of each of the upper side wall 12a and the lower side wall 12b is, for example, 540 mm.

The bottom portion 12c is provided on the lower end side of the lower side wall 12b. Further, an upper end portion of the upper side wall 12a is open. The upper end opening of the upper side wall 12a is closed by a dielectric window 18. The dielectric window 18 is sandwiched between the upper end portion of the upper side wall 12a and the top portion 12d. A sealing member SL1 may be interposed between the dielectric window 18 and the upper end portion of the upper side wall 12a. The sealing member SL1 is, for example, an O-ring and contributes to the hermetic sealing of the processing container 12. The container upper portion 12A and the container lower portion 12B can be formed of, for example, aluminum.

The plasma processing apparatus 10 further includes a stage 20 provided in the container lower portion 12B of the processing container 12. The stage 20 is provided below the dielectric window 18. For example, the distance between the lower surface of the dielectric window 18 and the upper surface of the stage 20 is 245 mm. In one exemplary embodiment, the stage 20 includes a lower electrode LE and an electrostatic chuck ESC.

The lower electrode LE includes a first plate 22a and a second plate 22b. Both the first plate 22a and the second plate 22b have a substantially disk shape and are made of, for example, aluminum. The first plate 22a is supported by a tubular support part SP1. The support part SP1 extends vertically upward from the bottom portion 12c. The second plate 22b is provided on the first plate 22a and electrically connected to the first plate 22a.

The lower electrode LE is electrically connected to a radio-frequency power source RFG through a power supply rod PFR and a matching unit MU. The radio-frequency power source RFG supplies radio-frequency bias power to the lower electrode LE. The radio-frequency bias power which is generated by the radio-frequency power source RFG can have a certain frequency, for example, a frequency of 13.65 MHz, which is suitable for controlling the energy of ions which are drawn into the wafer W. The matching unit MU accommodates a matching device for performing matching between impedance on the radio-frequency power source RFG side and impedance on the load side such as mainly the electrode, plasma, and the processing container 12. For example, a blocking capacitor for self-bias generation can be included in the matching device.

The electrostatic chuck ESC is provided on the second plate 22b. The electrostatic chuck ESC provides a placing region MR for placing the wafer W on the processing space S side. The placing region MR is a substantially circular region substantially orthogonal to the axis Z and can have a diameter approximately equal to the diameter of the wafer W or a diameter slightly smaller than the diameter of the wafer W. Further, the placing region MR configures the upper surface of the stage 20, and the center of the placing region MR, that is, the center of the stage 20 is located on the axis Z.

The electrostatic chuck ESC holds the wafer W by an electrostatic attraction force. The electrostatic chuck ESC includes an attraction electrode provided in a dielectric. A direct-current power supply DCS is connected to the attraction electrode of the electrostatic chuck ESC through a switch SW and a covered wire CL. The electrostatic chuck ESC can hold the wafer W by attracting the wafer W to the upper surface thereof by a Coulomb force which is generated by a direct-current voltage which is applied from the direct-current power supply DCS. A focus ring FR annularly surrounding the periphery of the wafer W is provided on the outside in a radial direction of the electrostatic chuck ESC.

An annular flow path 24g is formed in the interior of the second plate 22b. A refrigerant is supplied to the flow path 24g from a chiller unit through a pipe PP1. The refrigerant supplied to the flow path 24g is recovered to the chiller unit through a pipe PP3. Further, in the plasma processing apparatus 10, a heat transfer gas, for example, He gas, from a heat transfer gas supply unit is supplied between the upper surface of the electrostatic chuck ESC and the back surface of the wafer W through a supply pipe PP2.

A space is provided outside the outer periphery of the stage 20, that is, between the stage 20 and the lower side wall 12b. The space serves as an exhaust path VL having an annular shape when viewed in a plan view. An annular baffle plate 26 having a plurality of through-holes is provided in the middle of the exhaust path VL in the direction of the axial Z. The exhaust path VL is connected to an exhaust pipe 28 which provides an exhaust port 28h. The exhaust pipe 28 is mounted to the bottom portion 12c of the processing container 12. An exhaust device 30 is connected to the exhaust pipe 28. The exhaust device 30 has a pressure regulator and a vacuum pump such as a turbo-molecular pump. The exhaust device 30 can reduce the pressure in the processing space S in the processing container 12 to a desired degree of vacuum. Further, the gas supplied to the wafer W flows toward the outside of the edge of the wafer W along the surface of the wafer W by operating the exhaust device 30 and is exhausted from the outer periphery of the stage 20 through the exhaust path VL.

In one exemplary embodiment, the plasma processing apparatus 10 can further include heaters HT, HS, HC, and HE as temperature control mechanisms. The heater HT is provided in the top portion 12d and extends in an annular shape to surround an antenna 14. The heater HS is provided in the upper side wall 12a and extends in an annular shape. The heater HS may be further provided in the lower side wall 12b. The heater HC is provided in the second plate 22b or in the electrostatic chuck ESC. The heater HC is provided below a central portion of the placing region MR described above, that is, in a region crossing the axis Z. Further, the heater HE extends in an annular shape to surround the heater HC. The heater HE is provided below an outer edge portion of the placing region MR described above.

In one exemplary embodiment, the plasma processing apparatus 10 can further include the antenna 14, a coaxial waveguide 16, a microwave generator 32, a tuner 34, a waveguide 36, and a mode converter 38. The antenna 14, the coaxial waveguide 16, the dielectric window 18, the microwave generator 32, the tuner 34, the waveguide 36, and the mode converter 38 configure a plasma generation source for exciting the gas which is introduced into the processing container.

The microwave generator 32 generates microwaves having a frequency of, for example, 2.45 GHz. The microwave generator 32 is connected to an upper portion of the coaxial waveguide 16 through the tuner 34, the waveguide 36, and the mode converter 38. The coaxial waveguide 16 extends along the axis Z which is a central axis thereof.

The coaxial waveguide 16 includes an outer conductor 16a and an inner conductor 16b. The outer conductor 16a has a cylindrical shape extending with the axis Z as the center. A lower end of the outer conductor 16a is electrically connected to an upper portion of a cooling jacket 40 having an electrically conductive surface. The inner conductor 16b is provided coaxially with the outer conductor 16a inside the outer conductor 16a. The inner conductor 16b has a cylindrical shape extending with the axis Z as the center. A lower end of the inner conductor 16b is connected to a slot plate 44 of the antenna 14.

The antenna 14 introduces microwaves into the processing container 12. The antenna 14 is provided to face the stage 20 above the stage 20. The antenna 14 is disposed in an opening formed in the top portion 12d. The antenna 14 includes a dielectric plate 42, the slot plate 44, and the dielectric window 18. The dielectric plate 42 shortens the wavelength of the microwave. The dielectric plate 42 has a substantially disk shape. The dielectric plate 42 is made of, for example, quartz or alumina. The dielectric plate 42 is sandwiched between the slot plate 44 and the lower surface of the cooling jacket 40. An example of the antenna 14 is a radial line slot antenna.

Figure 2:
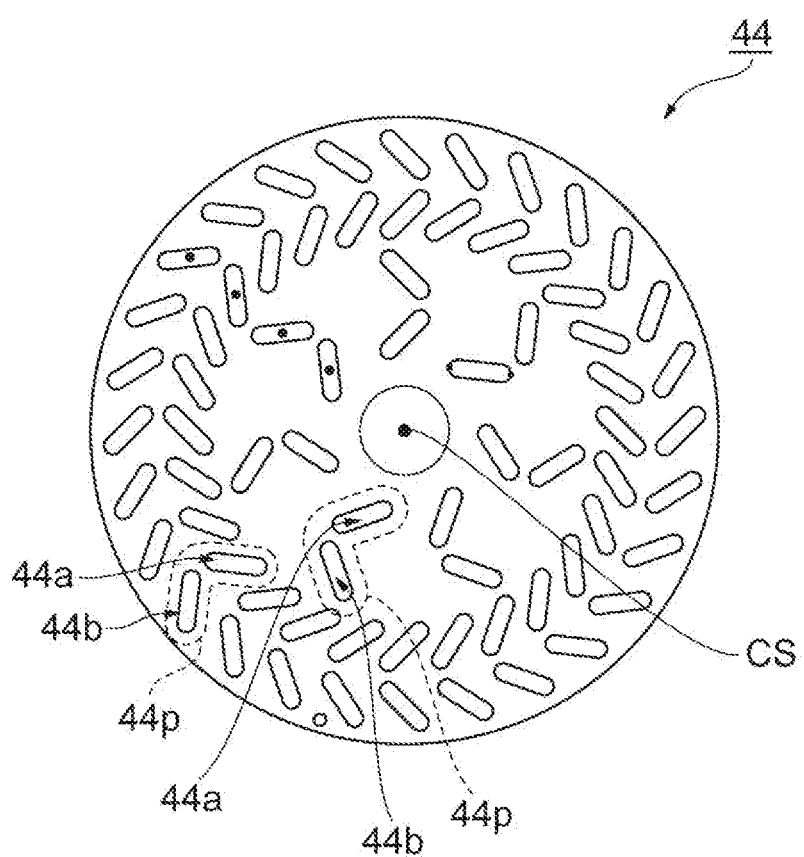
FIG. 2 is a plan view illustrating an example of a slot plate.

FIG. 2 is a plan view illustrating an example of the slot plate. The slot plate 44 has the form of a thin plate and has a disk shape. Both surfaces of the slot plate 44 in a plate thickness direction thereof are flat. A center CS of the slot plate 44 is located on the axis Z. A plurality of slot pairs 44p are provided in the slot plate 44. Each of the plurality of slot pairs 44p includes two slot holes 44a and 44b penetrating in the plate thickness direction. The planar shape of each of the slot holes 44a and 44b is an elongated hole shape. In each of the slot pairs 44p, a direction in which the major axis of the slot hole 44a extends and a direction in which the major axis of the slot hole 44b extends cross each other or are orthogonal to each other. The plurality of slot pairs 44p are arranged in a circumferential direction. In the example illustrated in FIG. 2, the plurality of slot pairs 44p are arranged in the circumferential direction along two concentric circles. On each concentric circle, the slot pairs 44p are arranged at approximately equal intervals. The slot plate 44 is provided on an upper surface 18u of the dielectric window 18.

Figure 3:
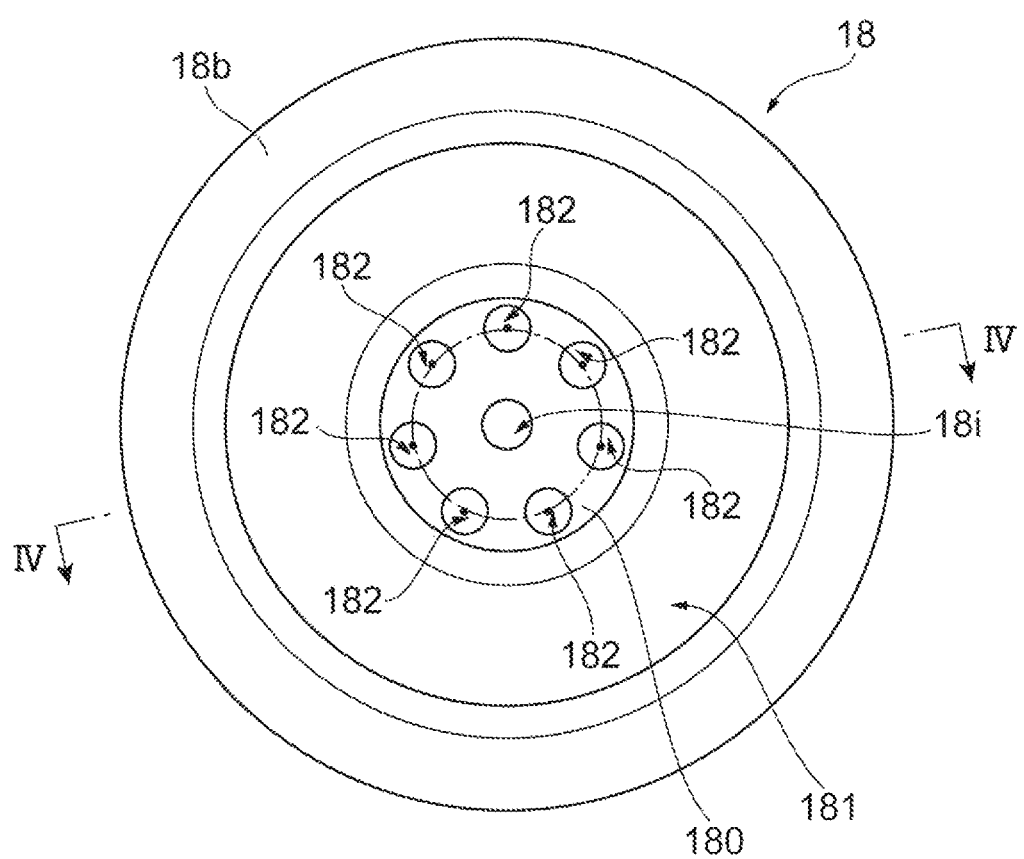
FIG. 3 is a plan view illustrating an example of a dielectric window.
Figure 4:
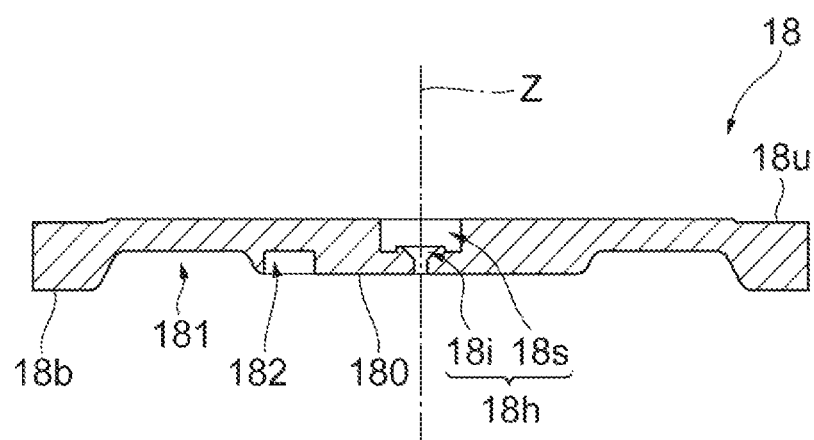
FIG. 4 is a sectional view taken along line IV-IV of FIG. 3.

FIG. 3 is a plan view illustrating an example of the dielectric window, and FIG. 4 is a sectional view taken along line IV-IV of FIG. 3. As illustrated in FIGS. 3 and 4, the dielectric window 18 is a substantially disk-shaped member made of a dielectric such as quartz. A through-hole 18h is formed at the center of the dielectric window 18. An upper portion of the through-hole 18h is a space 18s in which an injector 50b of a central introduction part 50 (described later) is accommodated, and a lower portion of the through-hole 18h is a gas discharge port 18i of the central introduction part 50 (described later). The center axis of the dielectric window 18 coincides with the axis Z.

The surface on the side opposite to the upper surface 18u of the dielectric window, that is, a lower surface 18b is in contact with the processing space S and is a surface on the side where plasma is generated. The lower surface 18b has various shapes. Specifically, the lower surface 18b has a flat surface 180 defined at the central region surrounding the gas discharge port 18i. The flat surface 180 is a flat surface orthogonal to the axis Z. The lower surface 18b has a first recessed portion 181 having an annular shape. The first recessed portion 181 is formed in an annular shape at a region on the outside in the radial direction of the flat surface 180 and is recessed in a tapered shape toward the inner side in the plate thickness direction of the dielectric window 18.

Further, the lower surface 18b has a plurality of second recessed portions 182. The plurality of second recessed portions 182 are recessed toward the inner side in the plate thickness direction from the flat surface 180. The number of the plurality of second recessed portions 182 is seven in the example illustrated in FIGS. 3 and 4. The plurality of second recessed portions 182 are formed at equal intervals along the circumferential direction. Further, the plurality of second recessed portions 182 have a circular planar shape in a plane orthogonal to the axis Z.

Figure 5:
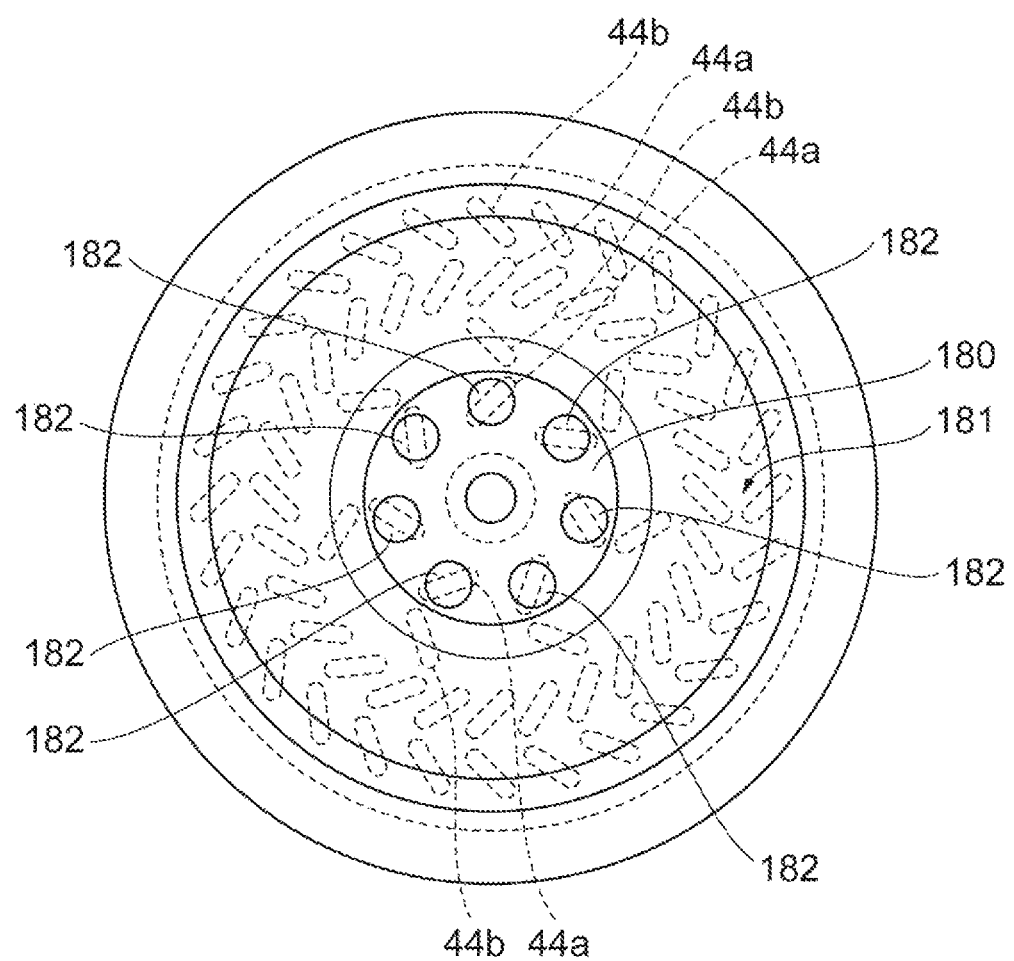
FIG. 5 is a plan view illustrating a state where the slot plate illustrated in FIG. 2 is provided on the dielectric window illustrated in FIG. 3.

FIG. 5 is a plan view illustrating a state where the slot plate illustrated in FIG. 2 is provided on the dielectric window illustrated in FIG. 3, and illustrate the state when the dielectric window 18 is viewed from the lower side. As illustrated in FIG. 5, when viewed in a plan view, that is, in a case of being viewed in the direction of the axis Z, the slot pairs 44p provided along the concentric circle on the outer side in the radial direction overlap the first recessed portion 181. Further, the slot holes 44b of the slot pairs 44p provided along the concentric circle on the inner side in the radial direction overlap the first recessed portion 181. In addition, the slot holes 44a of the slot pairs 44p provided along the concentric circle on the inner side in the radial direction respectively overlap the plurality of second recessed portions 182.

Referring to FIG. 1 again, in the plasma processing apparatus 10, the microwaves generated by the microwave generator 32 are propagated to the dielectric plate 42 through the coaxial waveguide 16 and applied to the dielectric window 18 from the slot holes 44a and 44b of the slot plate 44. Just below the dielectric window 18, the energy of the microwaves concentrates in the first recessed portion 181 and the second recessed portions 182 defined by the portions having a relatively thin plate thickness. Therefore, the plasma processing apparatus 10 can generate plasma such that the plasma is stably distributed in the circumferential direction and the radial direction.

In one exemplary embodiment, the plasma processing apparatus 10 includes the central introduction part 50. The central introduction part 50 is provided above the stage 20. The central introduction part 50 introduces gas toward the stage 20 along the axis Z. The central introduction part 50 includes a conduit 50a, the injector 50b, and the gas discharge port 18i. The conduit 50a passes through the inner hole of the inner conductor 16b of the coaxial waveguide 16. An end portion of the conduit 50a extends to the space 18s (refer to FIG. 4) defined in the dielectric window 18 along the axis Z. The injector 50b is accommodated in the space 18s and below the end portion of the conduit 50a. A plurality of through-holes extending in the direction of the axis Z are provided in the injector 50b. Further, the dielectric window 18 provides the gas discharge port 18i described above. The gas discharge port 18i is continuous below the space 18s and extends along the axis Z. The central introduction part 50 having such a configuration supplies gas to the injector 50b through the conduit 50a and discharges the gas from the injector 50b through the gas discharge port 18i. In this manner, the central introduction part 50 discharges the gas to just below the dielectric window 18 along the axis Z. That is, the central introduction part 50 introduces the gas into a plasma generation area having a high electron temperature. Further, the gas discharged from the central introduction part 50 flows toward the central region of the wafer W substantially along the axis Z.

A first gas source group GSG1 is connected to the central introduction part 50 through a first flow rate control unit group FCG1. The first gas source group GSG1 includes a plurality of first gas sources. The plurality of first gas sources are sources of various gases necessary for the processing of the wafer W. Such a gas can include a corrosive gas such as HBr gas in a case of etching a polycrystalline silicon layer. Further, the gas can include various gases such as a rare gas such as Ar or He, or an oxygen gas. The first flow rate control unit group FCG1 includes a plurality of flow rate controllers and a plurality of on-off valves. Each of the first gas sources is connected to the central introduction part 50 through a corresponding flow controller and on-off valve of the first flow rate control unit group FCG1.

The plasma processing apparatus 10 includes a peripheral introduction part 52. The peripheral introduction part 52 is provided in the processing container 12 by being sandwiched between the upper side wall 12a and the lower side wall 12b. For this reason, the peripheral introduction part 52 configures a part of the side wall of the processing container 12. The peripheral introduction part 52 is provided between the gas discharge port 18i of the central introduction part 50 and the upper surface of the stage 20 in the height direction, that is, the direction of the axis Z.

Figure 6:
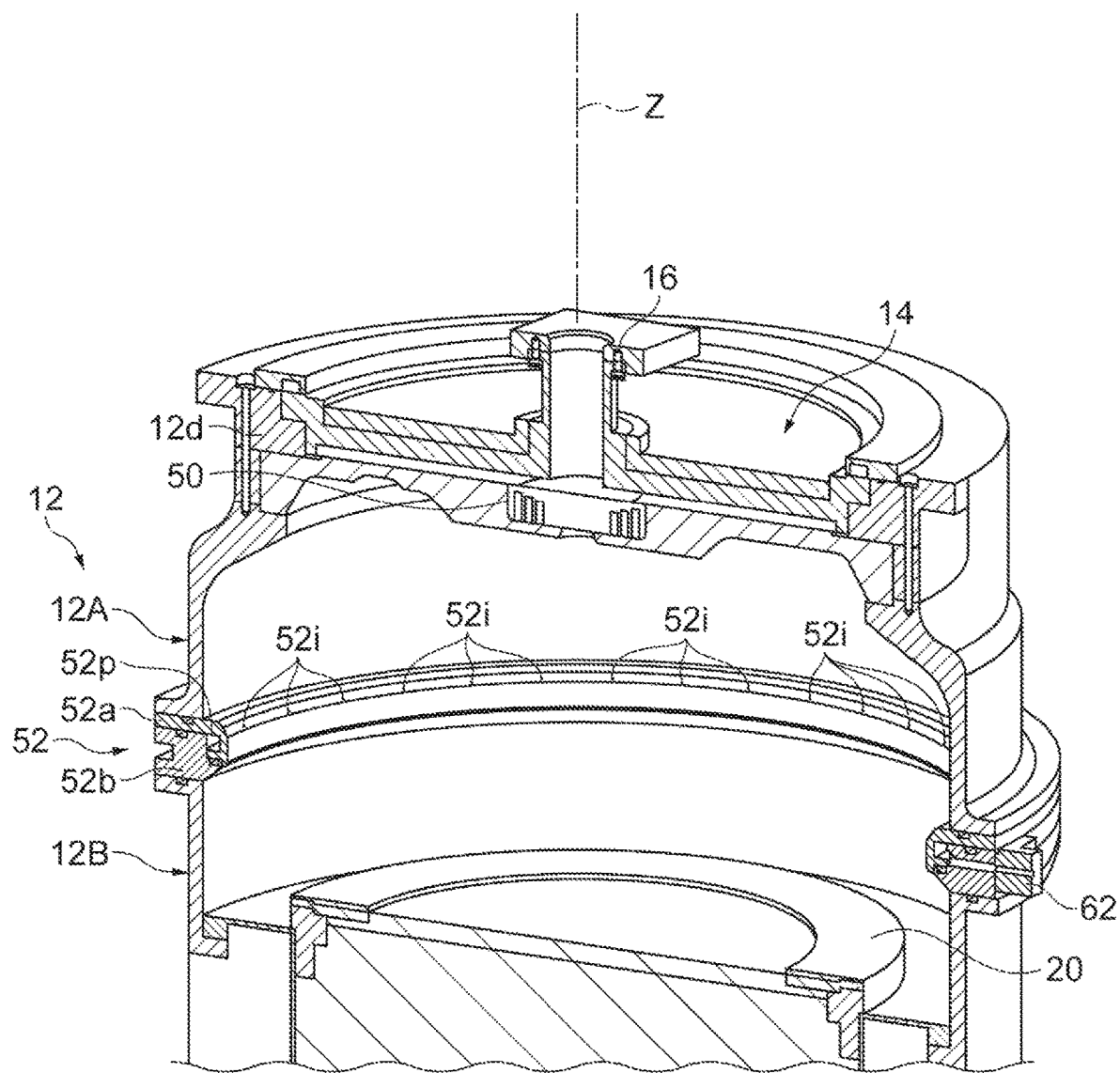
FIG. 6 is a sectional perspective view illustrating an example of a processing container.

FIG. 6 is a sectional perspective view illustrating an example of the processing container. As illustrated in FIG. 6, the peripheral introduction part 52 provides a plurality of gas discharge ports 52i arranged in the circumferential direction with respect to the axis Z. The plurality of gas discharge ports 52i introduce gas into the processing space S from positions along the side wall of the processing container 12. The peripheral introduction part 52 configures an annular pipe in which the plurality of gas discharge ports 52i are formed. A gas flow path 52p extending in the circumferential direction with respect to the axis Z is formed in the interior of the peripheral introduction part 52. The peripheral introduction part 52 is disposed, for example, at a distance of 90 mm upward from the upper surface of the stage 20. The peripheral introduction part 52 can be formed of, for example, aluminum.

Each of the plurality of gas discharge ports 52i extends such that the gas discharge port 52i becomes more distant from the upper surface of the stage 20 as it comes close to the axis Z. In other words, each of the plurality of gas discharge ports 52i extends in a direction having a component toward the center of the processing space S and a component away from the stage 20 along the axis Z, that is, extends obliquely upward. In a case of assuming an imaginary plane orthogonal to the axis Z, the center line of each gas discharge port 52i forms an angle with respect to the imaginary plane. This angle can have an angle of 30 degrees or more and 45 degrees or less.

A second gas source group GSG2 (refer to FIG. 1) is connected to the annular gas flow path 52p of the peripheral introduction part 52 through a gas supply block 62 and a second flow rate control unit group FCG2 (refer to FIG. 1). The second gas source group GSG2 includes a plurality of second gas sources. The plurality of second gas sources are sources of various gases necessary for the processing of the wafer W. Such a gas can include a corrosive gas such as HBr gas in a case of etching a polycrystalline silicon layer. Further, the gas can include various gases such as a rare gas such as Ar or He, or an oxygen gas. The second flow rate control unit group FCG2 includes a plurality of flow rate controllers and a plurality of on-off valves. Each of the second gas sources is connected to the peripheral introduction part 52 through a corresponding flow rate controller and on-off valve of the second flow rate control unit group FCG2.

The plasma processing apparatus 10 can independently control the type of the gas which is introduced into the processing space S from the central introduction part 50 and the flow rate of one or more gases which are introduced into the processing space S from the central introduction part 50, and also independently controls the type of gas which is introduced into the processing space S from the peripheral introduction part 52 and the flow rate of one or more gases which are introduced into the processing space S from the peripheral introduction part 52.

Further, the gas introduced from the peripheral introduction part 52 flows obliquely upward in the processing space S and merges with the gas which is introduced from the central introduction part 50, or flows along the flow of the gas which is introduced from the central introduction part 50. Therefore, on the wafer W placed on the stage 20, the gas flows in the direction toward the edge of the wafer W from the center of the wafer W. Therefore, a stay of the gas on the wafer W is suppressed. As a result, the in-plane uniformity of the processing of the wafer W is improved.

In one exemplary embodiment, the plasma processing apparatus 10 can further include a control unit Cnt, as illustrated in FIG. 1. The control unit Cnt can be a controller such as a programmable computer device. The control unit Cnt can control each part of the plasma processing apparatus 10 according to a recipe-based program. For example, the control unit Cnt can send a control signal to the flow rate controller and the on-off valve of the first flow rate control unit group FCG1 to adjust the gaseous species and the flow rate of the gas which is introduced from the central introduction part 50. The control unit Cnt can send a control signal to the flow rate controller and the on-off valve of the second flow rate control unit group FCG2 to adjust the gaseous species and the flow rate of the gas which is introduced from the peripheral introduction part 52. The control unit Cnt can supply control signals to the microwave generator 32, the radio-frequency power source RFG, and the exhaust device 30 to control the power of the microwave, the power and ON/OFF of the radio-frequency bias power, and the pressure in the processing container 12. Further, the control unit Cnt can send a control signal to the heater power supply connected to the heaters HT, HS, HC, and HE to adjust the temperatures of these heaters.

A plasma processing method which is carried out using the plasma processing apparatus 10 described above will be described. In this method, first, the wafer W is prepared. Specifically, the wafer W is placed on the stage 20 and attracted to the stage 20 by the electrostatic chuck ESC. Then, the exhaust device 30 is operated, whereby the pressure in the space inside the processing container 12 is set to a predetermined pressure. Subsequently, gases are introduced into the processing container 12 from the central introduction part 50 and the peripheral introduction part 52. Subsequently, plasma of the gases introduced into the processing container 12 is generated. The wafer W is processed by the plasma of the gases.

[Details of Peripheral Introduction Part]

Figure 7:
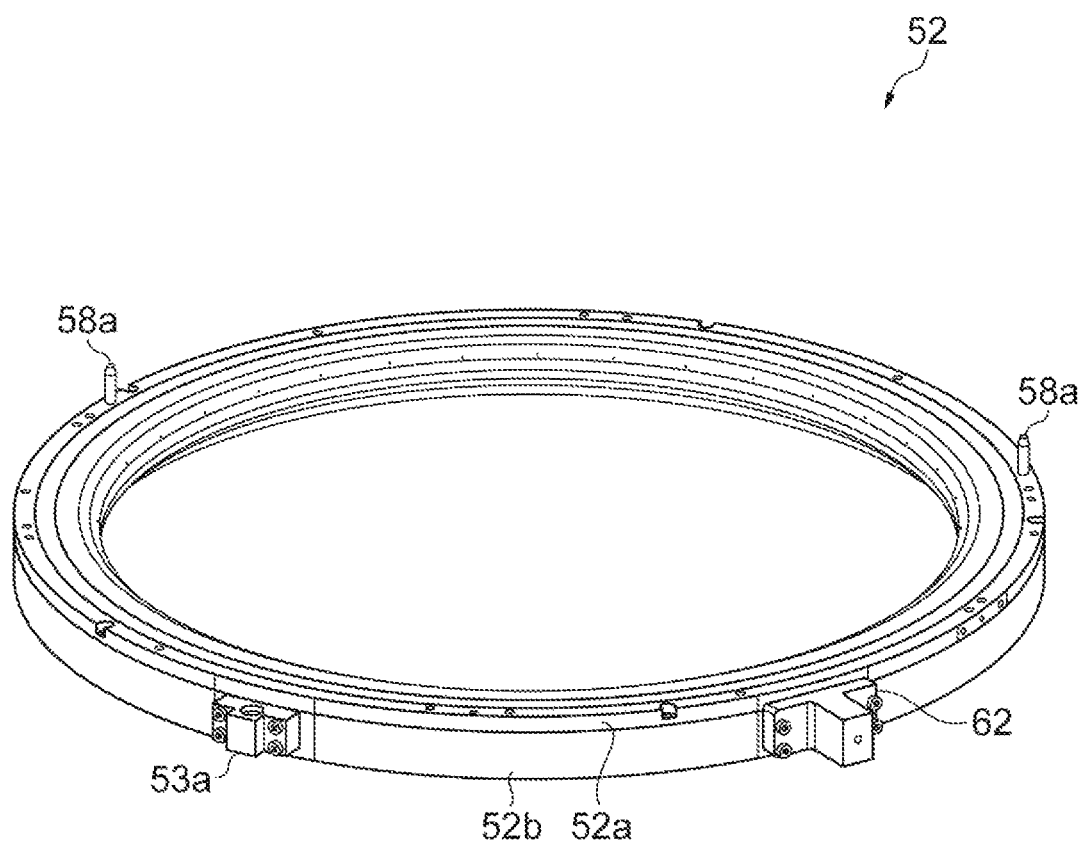
FIG. 7 is a perspective view illustrating an example of a peripheral introduction part.
Figure 8:
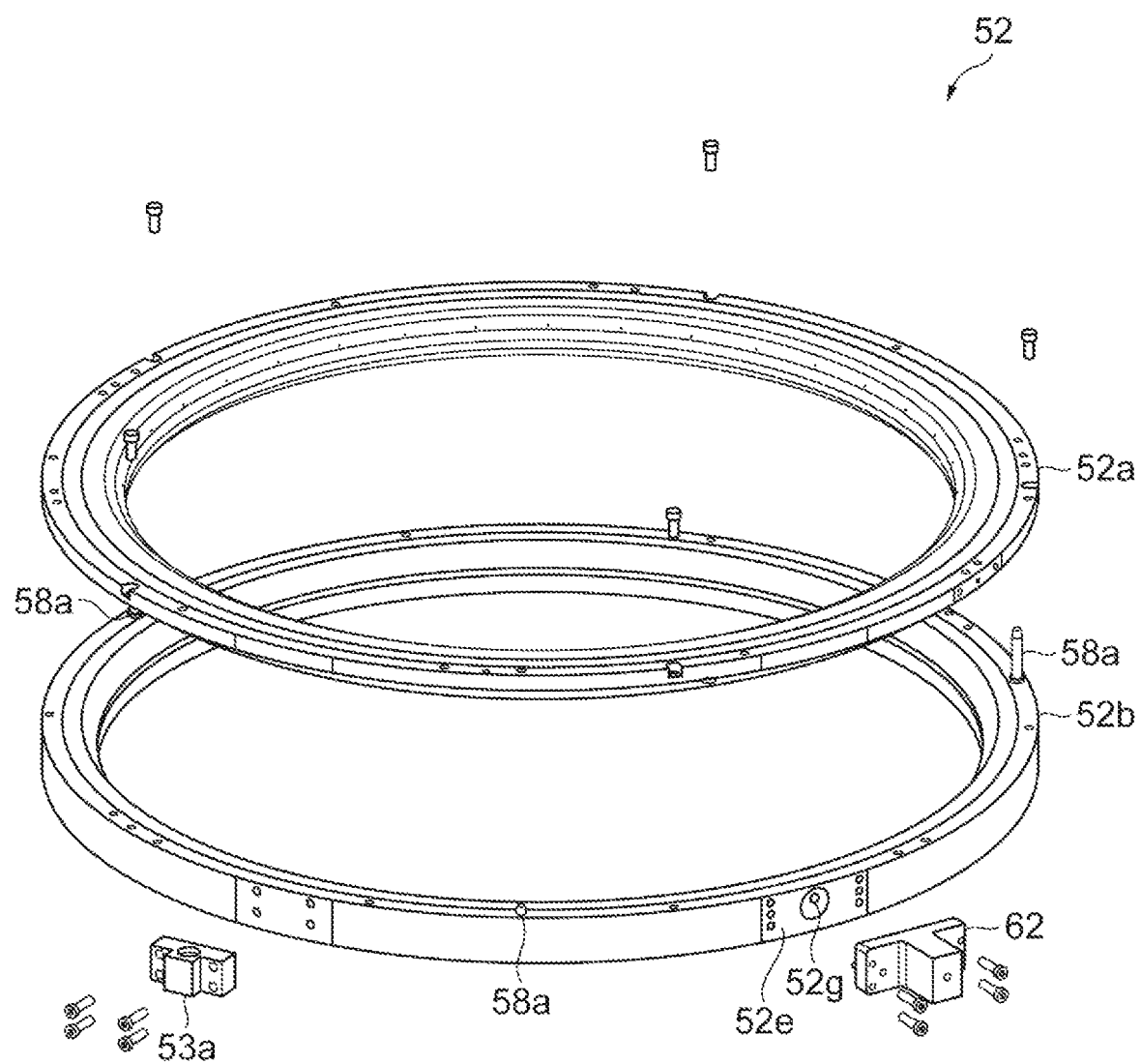
FIG. 8 is an exploded view illustrating an example of the peripheral introduction part.
Figure 9:
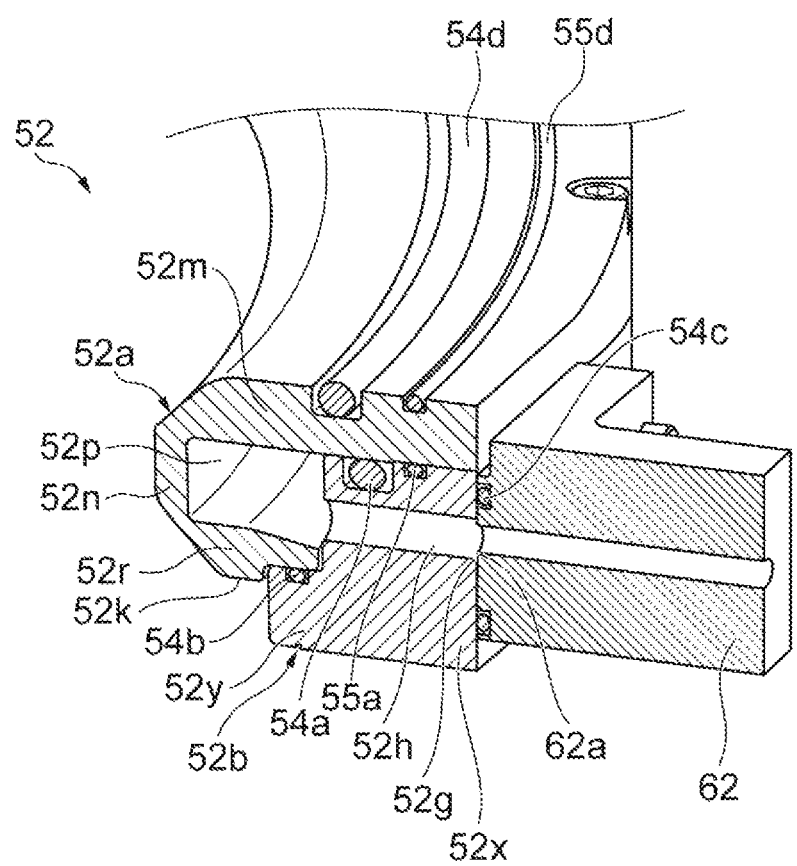
FIG. 9 is a sectional perspective view illustrating an example of the peripheral introduction part and a gas supply block.

FIG. 7 is a perspective view illustrating an example of the peripheral introduction part. FIG. 8 is an exploded view illustrating an example of the peripheral introduction part. FIG. 9 is a sectional perspective view illustrating an example of the peripheral introduction part and the gas supply block. As illustrated in FIGS. 7 to 9, the peripheral introduction part 52 is an assembly in which at least two members are assembled. The at least two members can include a first ring member 52a and a second ring member 52b. Each of the first ring member 52a and the second ring member 52b is an annular member. The first ring member 52a and the second ring member 52b are assembled, whereby an annular pipe member is configured, and the gas flow path 52p is formed in the interior of the annular pipe member. As an example, the first ring member 52a defines the inner surface on the inner side in the radial direction of the gas flow path 52p, and the second ring member 52b defines the inner surface on the outer side in the radial direction of the gas flow path 52p.

As a more specific example, the first ring member 52a has a first base 52m, a first side portion 52n, and a first bottom portion 52r. The first base 52m is a flat portion having a ring shape and defines a ceiling of the gas flow path 52p at the lower surface thereof. The first side portion 52n is provided to be erected downward at an end portion on the inner side of the first base 52m and defines the side surface of the gas flow path 52p at the outer surface thereof. That is, the first side portion 52n defines an inner side surface that is closer to the axis Z, out of two side surfaces of the gas flow path 52p. The first bottom portion 52r is provided to be erected from a lower end portion of the first side portion 52n toward the outer side of the first base 52m and defines the bottom surface of the gas flow path 52p at the upper surface thereof. In this manner, the first ring member 52a defines the ceiling, the inner side surface, and the bottom surface among the inner surfaces of the gas flow path 52p. The first ring member 52a is formed of, for example, aluminum.

As an example, the second ring member 52b has a second base 52x and a stepped portion 52y. The second base 52x is a ring-shaped portion having a larger thickness than the gas flow path 52p and defines the side surface of the gas flow path 52p at the side surface on the inner side thereof. That is, the second base 52x defines an outer side surface that is farther from the axis Z, out of the two side surfaces of the gas flow path 52p. The stepped portion 52y is a portion protruding inward in the radial direction at the lower end portion on the inner side of the second ring member 52b. The second ring member 52b is formed of, for example, aluminum.

The first ring member 52a and the second ring member 52b are assembled, whereby the lower surface of the first base 52m of the first ring member 52a is supported in a state of being in contact with the upper surface of the second base 52x of the second ring member 52b. The lower surface of the first bottom portion 52r of the first ring member 52a is supported on the upper surface of the stepped portion 52y of the second ring member 52b. The first ring member 52a and the second ring member 52b are fixed to each other by screws in the assembled state. In the illustrated example, five screws are screwed to screw holes provided in the first ring member 52a and the second ring member 52b.

A sealing member 54a such as an O-ring may be provided between the lower surface of the first base 52m of the first ring member 52a and the upper surface of the second base 52x of the second ring member 52b. For example, the sealing member 54a is an annular member and is accommodated in an annular groove formed on the upper surface of the second base 52x. A sealing member 54b such as an O-ring may be provided between the lower surface of the first bottom portion 52r of the first ring member 52a and the upper surface of the stepped portion 52y of the second ring member 52b. For example, the sealing member 54b is an annular member and is accommodated in an annular groove formed on the upper surface of the stepped portion 52y. Due to the sealing members 54a and 54b, the airtightness between the first ring member 52a and the second ring member 52b is secured.

An electrically conductive member 55a may be provided between the lower surface of the first base 52m of the first ring member 52a and the upper surface of the second base 52x of the second ring member 52b. As an example, the electrically conductive member 55a is an annular string-like member in which a thin metal is spirally wound. For example, the electrically conductive member 55a is accommodated in an annular groove formed on the upper surface of the second base 52x. Due to the electrically conductive member 55a, the conductivity between the first ring member 52a and the second ring member 52b is improved.

A cover portion 52k protruding downward may be formed at the lower end portion on the inner side of the first bottom portion 52r of the first ring member 52a. The cover portion 52k extends further downward on the inner side in the radial direction than the connection surface between the lower surface of the first bottom portion 52r of the first ring member 52a and the upper surface of the stepped portion 52y of the second ring member 52b at the time of assembly. The cover portion 52k covers the connection surface between the lower surface of the first bottom portion 52r of the first ring member 52a and the upper surface of the stepped portion 52y of the second ring member 52b such that the connection surface does not directly face plasma. In this way, plasma or ions cannot reach the connection surface unless the gap formed between the cover portion 52k and the second ring member 52b is increased. By providing the cover portion 52k, it is possible to suppress the shortening of the life of the sealing member 54b.

A fixed block 53a is fixed to the side surface of the second ring member 52b by screws. The fixed block 53a is a part of a pushing screw mechanism which disconnects the connection between the container upper portion 12A and the peripheral introduction part 52. Details thereof will be described later.

A connection surface 52e for connecting the gas supply block 62 is formed on the side surface of the second ring member 52b. A gas introduction port 52g communicating with the gas flow path 52p is formed on the connection surface 52e. The gas supply block 62 is fixed to the connection surface 52e of the second ring member 52b by screws. The gas supply block 62 has a gas output port 62a for outputting the gas supplied from the second gas source group GSG2 (refer to FIG. 1). The gas supply block 62 is positioned and fixed such that the gas output port 62a is aligned with the gas introduction port 52g of the second ring member 52b. A sealing member 54c such as an O-ring may be provided between the gas supply block 62 and the second ring member 52b. For example, the sealing member 54c is an annular member and is accommodated in an annular groove formed on the connection surface of the gas supply block 62 to surround the gas output port 62a. Due to the sealing member 54c, the airtightness between the gas supply block 62 and the second ring member 52b is secured. The second ring member 52b has an intermediate flow path 52h connecting the gas introduction port 52g and the gas flow path 52p. The gas supplied from the second gas source group GSG2 passes through the gas output port 62a of the gas supply block 62, the gas introduction port 52g, and the intermediate flow path 52h and is supplied to the gas flow path 52p.

Figure 10:
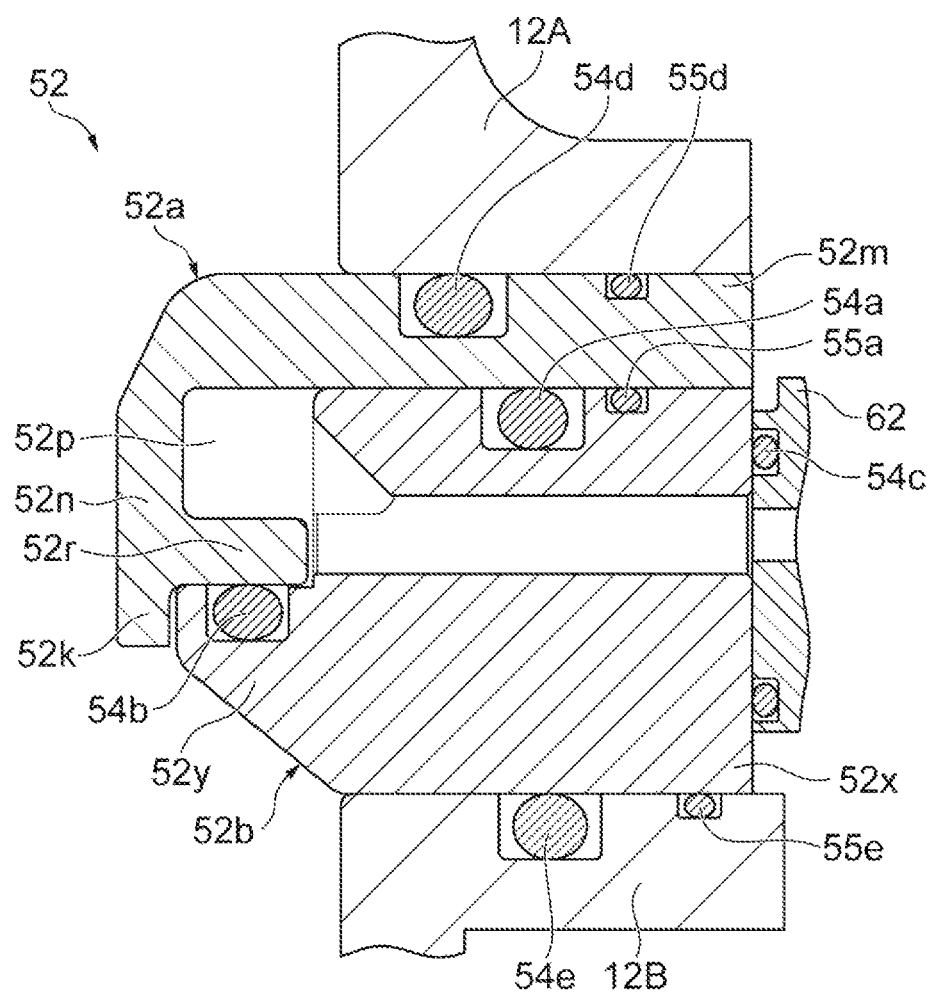
FIG. 10 is a sectional view illustrating an example of a state where the peripheral introduction part is mounted.
Figure 11:
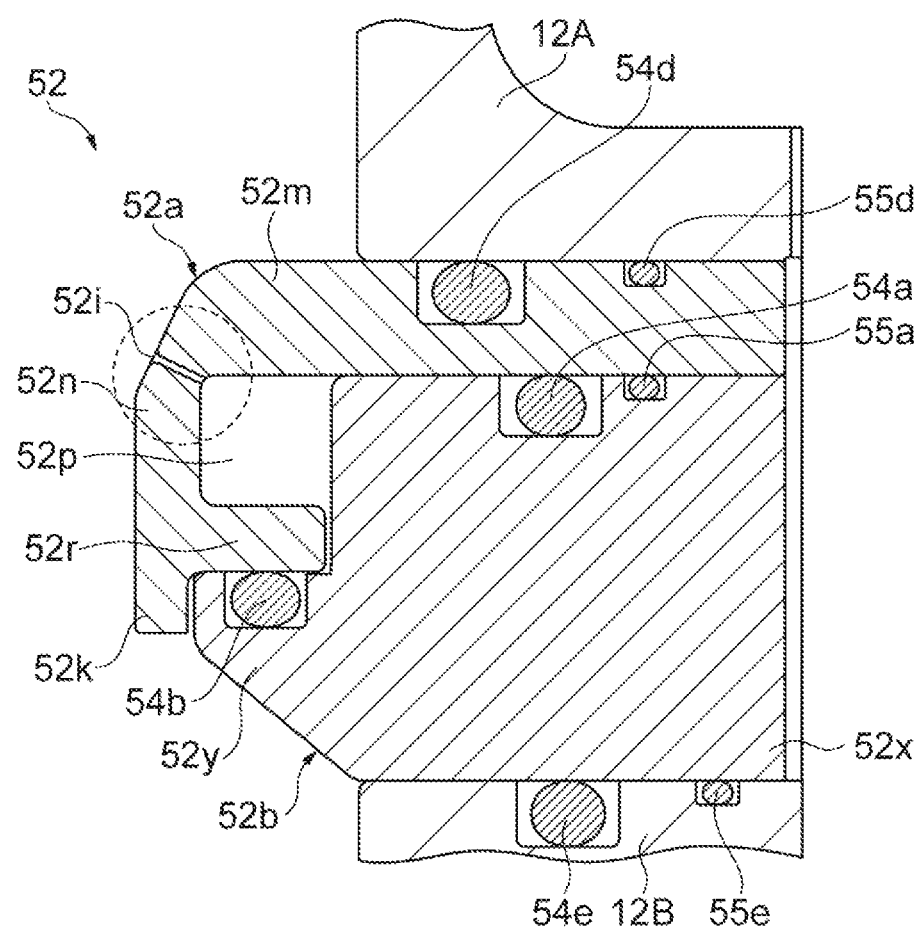
FIG. 11 is a sectional view illustrating an example of a state where the peripheral introduction part is mounted.

FIGS. 10 and 11 are sectional views illustrating an example of the state where the peripheral introduction part is mounted. FIG. 10 is a sectional view of a connection place with the gas supply block 62, and FIG. 11 is a sectional view of a portion where the gas discharge port 52i is formed. As illustrated in FIGS. 10 and 11, the peripheral introduction part 52 is sandwiched and supported between the container upper portion 12A and the container lower portion 12B.

As a more specific example, the peripheral introduction part 52 is supported in a state where the upper surface of the first base 52m of the first ring member 52a and the lower end portion of the container upper portion 12A are in contact with each other. A sealing member 54d such as an O-ring may be provided between the upper surface of the first base 52m and the lower end portion of the container upper portion 12A. For example, the sealing member 54d is an annular member and is accommodated in an annular groove formed on the upper surface of the first base 52m. Due to the sealing member 54d, the airtightness between the first ring member 52a and the container upper portion 12A is secured. An electrically conductive member 55d may be provided between the upper surface of the first base 52m and the lower end portion of the container upper portion 12A. As an example, the electrically conductive member 55d is an annular string-like member in which a thin metal is spirally wound. For example, the electrically conductive member 55d is accommodated in an annular groove formed on the upper surface of the first base 52m. Due to the electrically conductive member 55d, the conductivity between the first ring member 52a and the container upper portion 12A is improved.

Further, the peripheral introduction part 52 is connected in a state where the lower surface of the second base 52x of the second ring member 52b and the upper end portion of the container lower portion 12B are in contact with each other. A sealing member 54e such as an O-ring may be provided between the lower surface of the second base 52x and the upper end portion of the container lower portion 12B. For example, the sealing member 54e is an annular member and is accommodated in an annular groove formed in the upper end portion of the container lower portion 12B. Due to the sealing member 54e, the airtightness between the second ring member 52b and the container lower portion 12B is secured. An electrically conductive member 55e may be provided between the lower surface of the second base 52x and the upper end portion of the container lower portion 12B. As an example, the electrically conductive member 55e is an annular string-like member in which a thin metal is spirally wound. For example, the electrically conductive member 55e is accommodated in an annular groove formed in the upper end portion of the container lower portion 12B. Due to the electrically conductive member 55e, the conductivity between the second ring member 52b and the container lower portion 12B is improved.

In this manner, the peripheral introduction part 52 is thermally and electrically connected to the container upper portion 12A and the container lower portion 12B. The peripheral introduction part 52, the container upper portion 12A, and the container lower portion 12B may be formed of the same material.

In the first ring member 52a and the second ring member 52b, the outer surfaces facing plasma may be coated by thermal spraying. An example of thermal spraying metal is alumina or yttrium oxide ($Y_2O_3$). Further, in the first ring member 52a and the second ring member 52b, the outer surfaces defining the gas flow path 52p may be coated with a corrosion-resistant material. An example of the corrosion-resistant material is an oxide of aluminum. The aluminum oxide film is formed by alumite treatment. The aluminum oxide film is formed on the inner wall of the gas flow path 52p, whereby corrosion due to gas is suppressed.

Further, as illustrated in FIG. 11, the gas discharge port 52i is formed to communicate with a corner portion of the cross-section of the gas flow path 52p. The gas discharge port 52i is open obliquely upward from the upper portion on the inner side of the gas flow path 52p. At the time of the alumite treatment described above, the first ring member 52a and the second ring member 52b are put in an electrolytic solution, and an oxide film is formed by electrolysis. At this time, air pockets tend to be formed at the corner portion of the cross-section of the gas flow path. In a case where the air pockets are formed at the corner portion, the oxide film is not formed at the corner portion. The gas discharge port 52i is formed at the corner portion of the cross-section of the gas flow path 52p, whereby air is easy to escape, and therefore, it is possible to prevent the air pockets from staying in the corner portion.

Figure 12:
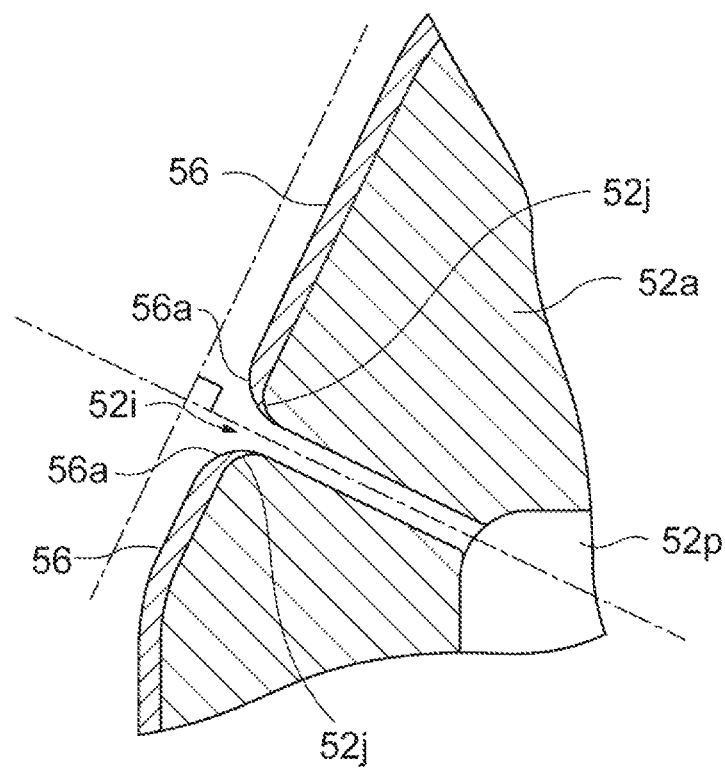
FIG. 12 is a partial sectional view illustrating an example of a gas discharge port of the peripheral introduction part.

FIG. 12 is a partial sectional view illustrating an example of the gas discharge port of the peripheral introduction part. As illustrated in FIG. 12, a tip portion 52j configuring the gas discharge port 52i is chamfered. As an example, a radius of curvature R of the tip portion 52j is 0.5. A thermally sprayed film 56 is formed on the outer surface of the first ring member 52a. The tip portion 52j is chamfered, whereby the thermally sprayed film 56 is also converged to be chamfered in the vicinity of the gas discharge port 52i. In this way, the thermally sprayed film 56 is not easily peeled off. The outer surface (thermally sprayed surface) of the first ring member 52a and the extending direction of the gas discharge port 52i intersect each other at right angle. In this way, chamfering of the tip portion 52j can be processed into a symmetrical shape, and the thermally sprayed film 56 is easy to be formed and is difficult to be peeled off.

Figure 13:
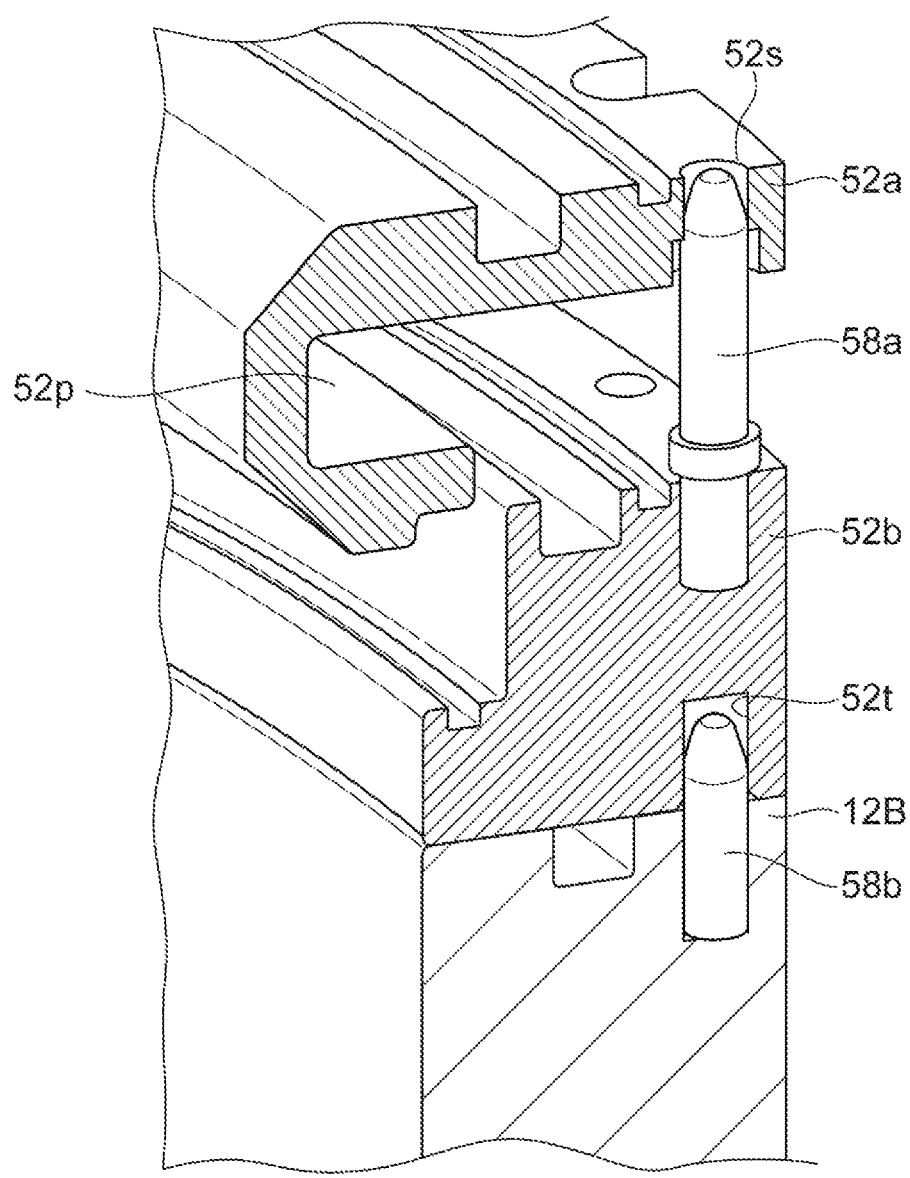
FIG. 13 is a sectional perspective view illustrating an example of assembly of the peripheral introduction part.
Figure 14:
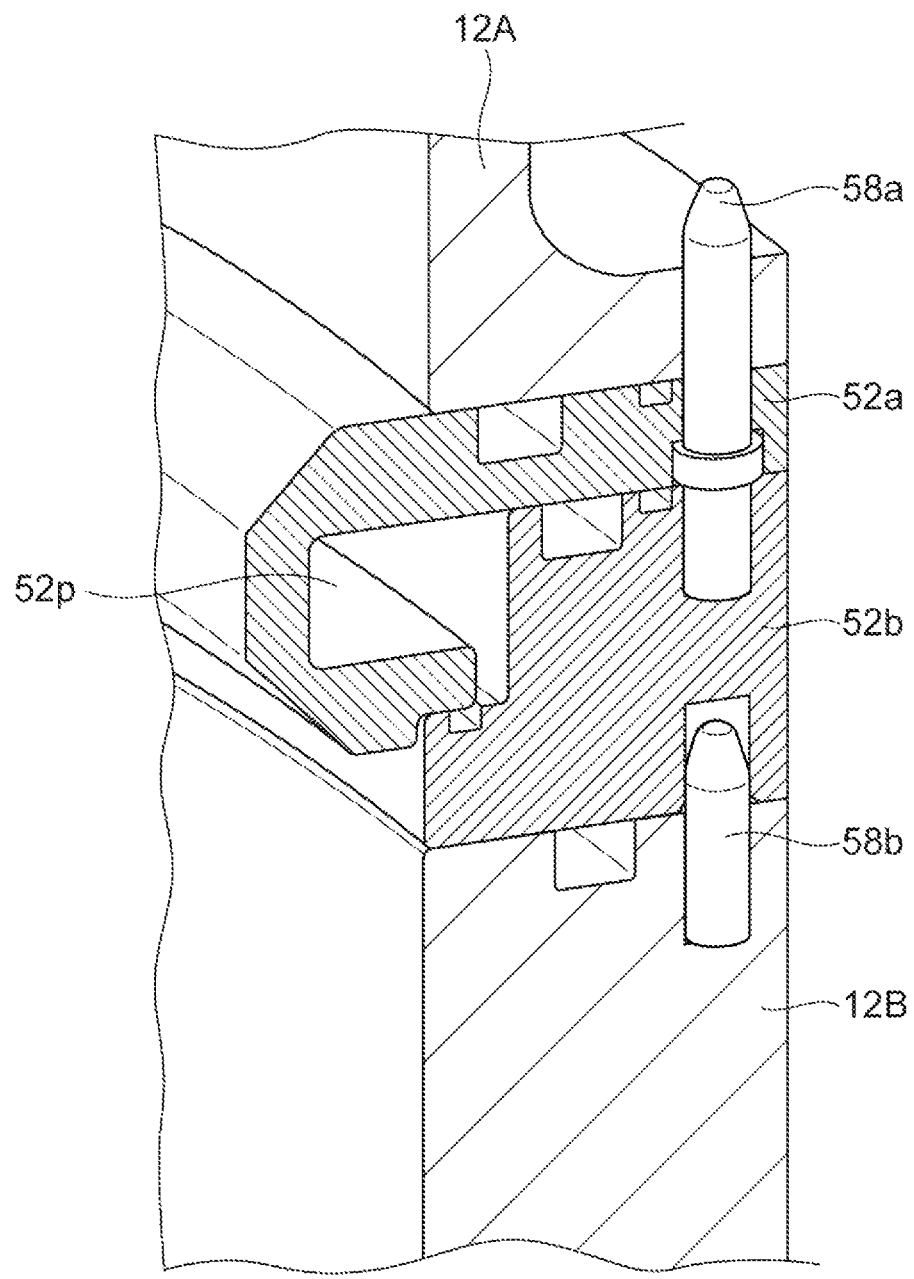
FIG. 14 is a sectional perspective view illustrating an example of assembly of the peripheral introduction part.

FIGS. 13 and 14 are sectional perspective views illustrating an example of assembly of the peripheral introduction part. FIG. 13 is a sectional perspective view during the assembly, and FIG. 14 is a sectional perspective view of the peripheral introduction part which has been assembled. As illustrated in FIGS. 13 and 14, the peripheral introduction part 52, and the container upper portion 12A and the container lower portion 12B may be positioned by positioning pins.

As an example, a first pin 58b is provided on the upper surface of the container lower portion 12B. On the lower surface of the second ring member 52b, a hole 52t for accommodating the first pin 58b is provided at a position corresponding to the first pin 58b. The first pin 58b provided on the upper surface of the container lower portion 12B is inserted into the hole 52t, whereby the second ring member 52b is positioned with respect to the container lower portion 12B. A plurality of the first pins 58b may be used.

As an example, a second pin 58a is provided on the upper surface of the second ring member 52b. On the lower surface of the first ring member 52a, a hole 52s for accommodating the second pin 58a is provided at a position corresponding to the second pin 58a. The second pin 58a provided on the upper surface of the second ring member 52b is inserted into the hole 52s, whereby the first ring member 52a is positioned with respect to the second ring member 52b. Further, a hole for accommodating the second pin 58a is provided in the lower end portion of the container upper portion 12A. In this way, the container upper portion 12A is positioned with respect to the first ring member 52a. A plurality of the second pins 58a may be used. In the example illustrated in FIG. 8, three second pins 58a are provided in the circumferential direction. As illustrated in FIG. 8, the lengths of the second pins 58a may be different from each other. The second pin 58a may be fixed to the second ring member 52b. The first pin 58b and the second pin 58a may be formed of, for example, stainless steel.

When opening the processing container 12 at the time of maintenance or the like, the second ring member 52b of the peripheral introduction part 52 and the container lower portion 12B are separated from each other. In this way, the container upper portion 12A and the peripheral introduction part 52 are separated from the container lower portion 12B, and thus the processing container 12 is opened. That is, at the time of the opening and closing of the processing container 12, the container upper portion 12A and the peripheral introduction part 52 operate integrally.

There is a case where the sealing member 54d disposed between the container upper portion 12A and the peripheral introduction part 52 is fixed due to pressure in assembly, heat in process processing, or the like. FIGS. 15A and 15B are sectional views for describing an example of the pushing screw mechanism for disconnecting the connection between the container upper portion and the peripheral introduction part. FIG. 15A is a sectional view before separation, and FIG. 15B is a sectional view after the separation.

As illustrated in FIG. 15A, a pushing screw mechanism 53 has a fixed block 53a, a support block 53b, and a screw 53c. The support block 53b is fixed to the side of the container upper portion 12A to face the fixed block 53a. The support block 53b has a screw hole extending toward the fixed block 53a. The screw 53c is screwed to a screw hole of the support block 53b. The screw 53c has such a length that the tip thereof can reach the fixed block 53a. The screw 53c is pushed in, whereby the tip of the screw 53c butts against the fixed block 53a and pushes the fixed block 53a. Since the first ring member 52a and the second ring member 52b are fixed to each other by screws, the pushing screw mechanism 53 is operated, whereby the container upper portion 12A and the peripheral introduction part 52 can be separated from each other, as illustrated in FIG. 15B. In this manner, by the pushing screw mechanism 53, it is possible to easily release the connection between the container upper portion 12A and the peripheral introduction part 52 fixed to each other by the sealing member 54d.

Summary of Exemplary Embodiment

According to the plasma processing apparatus 10 described above, since the peripheral introduction part 52 is an assembly, it is possible to clean the interior of the gas flow path 52p by releasing the coupling of at least two members forming the gas flow path 52p. Further, according to the plasma processing apparatus 10, since the ring-shaped peripheral introduction part 52 is fixed by being sandwiched between the upper side wall 12a and the lower side wall 12b, it can thermally expand uniformly in the circumferential direction. For this reason, in the plasma processing apparatus 10, it is possible to avoid positional misalignment between the axis Z passing through the center of the stage 20 and the axis passing through the center of the ring-shaped peripheral introduction part 52. Therefore, in the plasma processing apparatus 10, a decrease in the uniformity of the plasma processing due to the thermal expansion of the peripheral introduction part 52 can be suppressed and the maintainability of the peripheral introduction part 52 can be improved.

According to the plasma processing apparatus 10, it is possible to open the entire interior of the gas flow path 52p by releasing the coupling between the first ring member 52a and the second ring member 52b. Therefore, in the plasma processing apparatus 10, the maintainability can be further improved.

According to the plasma processing apparatus 10, the positioning of the container upper portion 12A, the first ring member 52a, the second ring member 52b, and the container lower portion 12B can be performed by the first pin 58b and the second pin 58a.

According to the plasma processing apparatus 10, the peripheral introduction part 52, the container upper portion 12A, and the container lower portion 12B are formed of the same material, whereby it is possible to make the thermal expansion coefficients thereof the same. Therefore, in the plasma processing apparatus 10, the misalignment between the axis Z passing through the center of the stage 20 and the axis passing through the center of the ring-shaped peripheral introduction part 52 due to the difference in thermal expansion between the processing container 12 and the peripheral introduction part 52 can be avoided.

According to the plasma processing apparatus 10, the gas discharge port 52i is formed at the corner portion of the cross-section of the gas flow path 52p, whereby it is possible to prevent the air pockets from staying in the corner portion. In this way, the alumite treatment can be performed uniformly.

This disclosure is not limited to the exemplary embodiment described above, and various modifications can be configured. For example, the plasma processing apparatus 10 is not limited to an apparatus that excites gas by using microwaves as a plasma source. The plasma processing apparatus may have any plasma source. For example, the plasma processing apparatus may be a capacitively coupled plasma processing apparatus or may be an inductively coupled plasma processing apparatus.

What is claimed is:
1. A plasma processing apparatus comprising:
a processing container formed by assembling a container upper portion having an upper side wall and a container lower portion having a lower side wall;
a stage provided in the container lower portion of the processing container; and
a peripheral introduction part configured to be an assembly, configured to be sandwiched between the upper side wall and the lower side wall, and configured to provide a plurality of gas discharge ports arranged in a circumferential direction with respect to an axis passing through a center of the stage, the assembly in which at least two members are assembled, the at least two members forming a gas flow path extending in the circumferential direction with respect to the axis in an interior thereof,
wherein the at least two members include a first ring member and a second ring member,
wherein the peripheral introduction part, the container upper portion and the container lower portion are thermally and electrically connected to each other,
wherein the peripheral introduction part, the container upper portion, and the container lower portion are formed of aluminum,
wherein an aluminum oxide film is formed on an inner wall of the gas flow path, and the plurality of the gas discharge ports communicate with a corner portion of a cross-section of the gas flow path,
wherein the gas discharge ports are open obliquely upward from the upper portion on the inner side of the gas flow path,
wherein the container lower portion and the second ring member are positioned by a first pin extending along the axis, and the second ring member, the first ring member, and the container upper portion are positioned by a second pin extending along the axis, and
wherein the first pin does not penetrate the first ring member, while the second pin penetrates the second ring member.

2. The plasma processing apparatus according to claim 1, wherein the gas flow path is formed by assembling the first ring member and the second ring member.

3. The plasma processing apparatus according to claim 2, further comprising:
   a central introduction part provided above the stage and configured to introduce gas toward the stage along the axis; and
   an antenna introducing microwaves into the processing container,
   wherein the antenna is provided to face the stage above the stage and has a dielectric window which is in contact with a space in the processing container, and
   a gas discharge port of the central introduction part, which extends along the axis, is formed in the dielectric window.

4. The plasma processing apparatus according to claim 1, further comprising:
   a central introduction part provided above the stage and configured to introduce gas toward the stage along the axis; and
   an antenna introducing microwaves into the processing container,
   wherein the antenna is provided to face the stage above the stage and has a dielectric window which is in contact with a space in the processing container, and
   a gas discharge port of the central introduction part, which extends along the axis, is formed in the dielectric window.

5. The plasma processing apparatus according to claim 1, further comprising:
   a central introduction part provided above the stage and configured to introduce gas toward the stage along the axis; and
   an antenna introducing microwaves into the processing container,
   wherein the antenna is provided to face the stage above the stage and has a dielectric window which is in contact with a space in the processing container, and
   a gas discharge port of the central introduction part, which extends along the axis, is formed in the dielectric window.

6. The plasma processing apparatus according to claim 1, wherein each tip portion of the gas discharge ports is chamfered.

7. The plasma processing apparatus according to claim 1, wherein the outer surface of the first ring member and each extending direction of the gas discharge ports intersect each other at a right angle.

8. The plasma processing apparatus according to claim 1, wherein the first pin is removable from the container lower portion and the second ring member, and the second pin is removable from the second ring member, the first ring member, and the container upper portion.

* * * * *